United States Patent
Wu et al.

(10) Patent No.: US 10,100,406 B2
(45) Date of Patent: Oct. 16, 2018

(54) HIGH PURITY TUNGSTEN HEXACHLORIDE AND METHOD FOR MAKING SAME

(71) Applicant: Air Products and Chemicals, Inc., Allentown, PA (US)

(72) Inventors: Xiaoxi Wu, Encinitas, CA (US); Sergei Vladimirovich Ivanov, Schnecksville, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 153 days.

(21) Appl. No.: 15/096,872

(22) Filed: Apr. 12, 2016

(65) Prior Publication Data

US 2016/0305020 A1   Oct. 20, 2016

Related U.S. Application Data

(60) Provisional application No. 62/149,155, filed on Apr. 17, 2015.

(51) Int. Cl.
*C23C 16/455* (2006.01)
*C23C 16/08* (2006.01)
(Continued)

(52) U.S. Cl.
CPC ............ *C23C 16/455* (2013.01); *B01D 1/14* (2013.01); *B01D 3/14* (2013.01); *B01D 3/322* (2013.01);
(Continued)

(58) Field of Classification Search
CPC ... C23C 16/08; C23C 16/455; C23C 16/4402; C01G 41/04; B01D 1/14; B01D 3/14; B01D 3/322; B01D 3/346; B01D 7/02
(Continued)

(56) References Cited

U.S. PATENT DOCUMENTS 2,743,169 A    4/1956 Hecker
4,029,750 A    6/1977 Schoener et al.
(Continued)

FOREIGN PATENT DOCUMENTS

CH    647418 A    1/1985
CN    1281823 A   1/2001
(Continued)

OTHER PUBLICATIONS

Extended EPO Search Report for EP 3081667, dated Jan. 31, 2017; 6 pages.*

(Continued)

*Primary Examiner* — Helene Klemanski
(74) *Attorney, Agent, or Firm* — Lina Yang

(57) ABSTRACT

Condensable metal halide materials, such as but not limited to tungsten chloride ($WCl_6$), can be used to deposit metal films or metal containing films in a chemical vapor deposition (CVD) or atomic layer deposition process. Described herein are high purity compositions comprising condensable materials and methods to purify condensable materials. In one aspect, there is provided a composition comprising: tungsten hexachloride which is substantially free of at least one impurity and wherein the tungsten hexachloride comprises at least 90%, preferably 95% and more preferably 99% by weight or greater of a $\beta$-$WCl_6$ and 5% by weight or less of the $\alpha$-$WCl_6$ as measured by X-ray diffraction.

20 Claims, 2 Drawing Sheets

(51) Int. Cl.
*C23C 16/44* (2006.01)
*C01G 41/04* (2006.01)
*B01D 1/14* (2006.01)
*B01D 3/14* (2006.01)
*B01D 3/32* (2006.01)
*B01D 3/34* (2006.01)
*B01D 7/02* (2006.01)

(52) U.S. Cl.
CPC ............... *B01D 3/346* (2013.01); *B01D 7/02* (2013.01); *C01G 41/04* (2013.01); *C23C 16/08* (2013.01); *C23C 16/4402* (2013.01)

(58) Field of Classification Search
USPC ................................................ 106/1.12, 1.18
See application file for complete search history.

(56) References Cited

U.S. PATENT DOCUMENTS

| | | | |
|---|---|---|---|
| 4,478,600 A | 10/1984 | Schoener et al. | |
| 6,368,389 B1 | 4/2002 | Birke et al. | |
| 9,598,766 B2* | 3/2017 | Birtcher | C23C 16/4402 |
| 2010/0255198 A1* | 10/2010 | Cleary | C23C 16/4402 |
| | | | 427/255.39 |
| 2013/0312855 A1 | 11/2013 | Birtcher et al. | |
| 2016/0305019 A1* | 10/2016 | Birtcher | C23C 16/45561 |

FOREIGN PATENT DOCUMENTS

| | | |
|---|---|---|
| CN | 103480208 A | 1/2014 |
| JP | 58161766 | 9/1983 |

OTHER PUBLICATIONS

Written Opinion for EP 3081667, dated Jan. 31, 2017; 10 pages.*
English translation of CH 647418; dated Jan. 1985; 5 pages.*
E.H.P. Cordfunke, et al, "The vapour pressure of WCl6", J. Chem. Thermodynamics, 1992, 329-331.
Sidney G. Parker, et al, "Separation of Metal Chlorides by Distillation", I&EC Process Design and Development, 1965, 365-368, Oct. 1965.
T. Takuma, et al, "Thermodynamic properties of tungsten hexachloride and tungsten pentachloride", Nippon Kagaku Kaishi, 1972, 865-873.
Cordfunke, et al., "The vapour pressure of WCl6", Journal of chemical Thermodynamics, Mar. 1, 1992, pp. 329-331.
Taylor, J. C., et al., "The Structure of [beta]-Tungsten Hexachloride by Powder Neutron and X-ray Diffraction", Acta Cryst. (1974) B30, pp. 1216-1220, May 1974.
Xing Tang, et al., "Preparation of Ultrafine CVD WC Powders Deposited from WCl6 Gas Mixtures", Journal De Physique IV, Colloque C5, supplement au Journal de Physique II, vol. 5, Jun. 1995, pp. 1013-1020.
Agnieszka Mos, et al., "Thermal Detection, Synthesis, and Structural Characterization of Compounds in the Co—W—Ci System", Journal of Cluster Science, Jan. 2015, vol. 26, Issue 1, pp. 187-198 (Abstract Only).

* cited by examiner

HIGH PURITY TUNGSTEN HEXACHLORIDE AND METHOD FOR MAKING SAME

CROSS REFERENCE TO RELATED PATENT APPLICATIONS

The present patent application claims the benefit of U.S. Provisional Patent Application Ser. No. 62/149,155 filed Apr. 17, 2015.

BACKGROUND OF THE INVENTION

Described herein is a composition comprising tungsten hexachloride ($WCl_6$) and methods for purification of tungsten hexachloride ($WCl_6$). More specifically, described herein is a composition comprising $WCl_6$ at a purity level that is sufficient to be suitable and having a certain crystalline phase which renders it suitable for use as a semiconductor manufacturing materials and a method, apparatus and system for making same.

Metal halides, such as $TaCl_5$, $WCl_6$, $WF_6$, and $HfCl_4$ are widely used in the electronic industry as precursors for deposition of metal or metal-containing films in a semiconductor device. It is important for these applications to use a high purity, metal halide material. Various purification processes, such as distillation and sublimation are known. These systems are typically very complicated in terms of heat management, because the boiling point of the target materials is relatively high, and the use of chlorine to prevent decomposition at these high temperatures presents corrosion hazards. To remedy this, special equipment is required to transfer the molten salt product into solid particles for harvesting.

U.S. Pat. No. 2,743,169 provides a sublimation method that can be used for separation and purification of metal chlorides. Typically, sublimation is operated at reduced pressure, which can enhance the productivity and reduce operation temperature. The product is usually attached to a cold wall, requiring additional labor or mechanical apparatus for harvesting and post production processes to give relatively uniformed particle size.

U.S. Pat. No. 4,478,600 provides a method of using fluidization as part of aluminum chloride purification process yielding controlled product particle size. The '600 Patent uses raw aluminum chloride that is first generated through chlorination reaction at high temperature, in vapor phase, followed by a condensing stage to remove most solid impurities. The vapor is then supplied into a fluidization chamber to form product particles. Non-condensable contents, such as chlorine, carbon dioxide, and fluidizing gas are passed through a cooling fin for temperature control. Part of the gas is recycled by a pump, whereas the rest is vented through a scrubber. The '600 Patent also uses a cold fluidization zone for product condensation and particle formation. $WCl_6$, is increasingly being adopted for use as a precursor material in a chemical vapor deposition (CVD) or atomic layer deposition (ALD) processes. However, $WCl_6$ may be present in two different crystal forms or polymorphs: α- and β-form. The crystal forms of $WCl_6$ can be identified by X-ray powder diffraction method. The α-form has rhombohderal cell (a=6.58 A, α=55 degrees), while β-form has hexagonal cell (a=10.493 A, c=5.725 A), as reported by J. C. Taylor and P. W. Wilson in *Acta Cryst.* (1974). B30, 1216. As the result of the differences in the crystal lattice two forms have some differences in the physical properties, such as crystal density and vapor pressure, as reported by E. H. P. Cordfunke and R. J. M. Konings in *J. Chem. Thermodynamics* 1992, 24, 329-3. Typically, the α-form crystal is a lower temperature phase while β-form crystal is a higher temperature phase and both forms typically present in $WCl_6$ at room temperature.

Precursor used in CVD or ALD processes need to have vaporization rate which is consistent from batch to batch and also doesn't change the solid phase during process start up and during the use. Therefore, there is a need in the art to provide delivery systems comprising $WCl_6$ composition that is substantially free of impurities, that has controlled particle size, and that comprises mostly high temperature stable □-form crystal rather than the α-form.

A common way to synthesize $WCl_6$ is by chlorinating ($Cl_2$) tungsten metal in a sealed tube at a temperature of about 600° C. as shown in reaction (1) below:

$$W(s) + 3Cl_2 = WCl_6 \qquad \text{Reaction (1)}$$

The reaction product or $WCl_6$ is a blue-black crystalline solid at room temperature and is present in both an alpha (α) phase and beta (β) phase. The reaction product is typically purified by sublimation. Sublimation, especially vacuum sublimation, produces mostly α-form material. For example, in a typical run, sublimation will produce about 56% of α-WCl6 and 44% of β-WCl6. Furthermore, sublimation requires the use of mechanical scraping for product harvesting, which yields a wide range of particle sizes.

As previously mentioned, metal halides such as tungsten hexachloride contain impurities which need to be removed in order to be suitable for use in the semiconductor industry. Typical impurities present in $WCl_6$ include, but not limited to, metals impurities, such as iron, chromium, and nickel chlorides, which have high boiling points like $WCl_6$, and lights or low boiling point impurities such as tungsten oxytetrachloride ($WOCl_4$) and tungsten pentachloride ($WCl_5$). Therefore, it is impracticable to use the fluidization method described, for example, in the '600 Patent, with a heat exchanger for temperature control, otherwise light impurities will attach to the cold fin and further contaminate the product.

Accordingly, there is a need to provide a method, system, apparatus or combinations thereof for preparing a high purity composition comprising $WCl_6$. There is also a need for a simple and economic process for $WCl_6$ purification for use in a vapor deposition process such as a chemical vapor deposition (CVD) or an atomic layer deposition (ALD) process, a process that yields a controlled particle size distribution, and a process that selectively products primarily the β-form crystal for better shelf life. There is also a need for a purification process that can be adopted for the purification of other metal halides such as $TaCl_5$, $WF_6$, $MoCl_6$, and $HfCl_4$ that allows for these materials to be used, for example, as precursors for depositing metal or metal-containing films in semiconductor devices.

BRIEF SUMMARY OF THE INVENTION

Accordingly, there is a need to provide a high purity composition comprising $WCl_6$, a system to purify a crude material comprising $WCl_6$ to obtain the high purity composition comprising $WCl_6$, a deliver system to deliver the high purity composition comprising $WCl_6$, a method to prepare the delivery system, and an apparatus for depositing a tungsten or tungsten-containing films in a semiconductor device.

The composition comprising a metal halide, and method, system, and apparatus for making same, fulfill at least one of the needs in the art. More specifically, there is provided a composition comprising $WCl_6$, that comprises less than 1% of impurities by weight of at least one impurity and wherein the $WCl_6$ comprises at least 90% by weight or greater, or at least 95% by weight or greater, or at least 96% by weight or greater, or at least 97% by weight or greater or at least 98% by weight or greater, or at least 99% by weight or greater, or at least 99.9% by weight or greater of β-form crystals as measured by X-ray diffraction (XRD), and a method, system, and apparatus for making $WCl_6$ or other metal halides that are suitable, for example, as precursors for depositing a metal or a metal-containing (e.g., a stoichiometric or non-stoichiometric WOx or WNx film). Also described herein is a method for purifying a metal halide such as without limitation tungsten hexachloride, a process that yields a metal halide with a controlled particle size, and a process that produces at least 95% by weight or greater of $WCl_6$ in β-form crystal (called β-$WCl_6$).

In one aspect, there is provided a system for purifying a composition comprising $WCl_6$ which is substantially free of at least one impurity and comprises at least 95% by weight or greater of β-form crystal as measured by XRD, the system comprising;
(a) a boiler comprising a crude material comprising $WCl_6$ and at least one impurity wherein the boiler is in electrical communication with a process controller and in fluid communication with a carrier gas wherein the boiler is heated to one or more temperatures at or above the boiling point of $WCl_6$ and a carrier gas in introduced into the boiler to provide a boiler vapor stream;
(b) a connector which is in fluid communication with the boiler and a condenser wherein the connector is also in fluid communication with a fluidizing gas and in electrical communication with a process controller wherein the fluidizing gas is introduced at a temperature below that of the boiler vapor stream and is combined with the boiler vapor stream to provide a condenser stream;
(c) the condenser wherein the condenser stream is maintained at one or more temperatures ranging from about 100 to about 180° C., wherein the condenser comprises a dip tube which is in fluid communication with a vacuum pump to withdraw the end product stream vapor comprising the composition, and wherein the condenser is in electrical communication with the process controller;
(d) a process controller; and,
(e) a vessel further in fluid communication with the dip tube and capable of housing the composition.

In another aspect, there is provided a method for preparing a composition comprising $WCl_6$ which is substantially free of at least one impurity and comprises at least 95% by weight or greater of β-form crystal as measured by XRD, the method comprising:
introducing a crude material comprising $WCl_6$ and at least one impurity into a boiler wherein the boiler is heated to one or more temperatures at or above the boiling point of $WCl_6$ to cause at least a portion of the crude material to vaporize;
introducing into the boiler a carrier gas wherein the carrier gas is heated to one or more temperatures to provide a boiler vapor stream;
transferring the boiler vapor stream into a connector which is in fluid communication with a condenser wherein at least a portion of the boiler vapor stream is contacted with a fluidizing gas and wherein the fluidizing gas is at a temperature below that of the boiler vapor stream to provide a condenser stream; and
introducing the condenser stream into the condenser wherein at least a portion of the condenser stream condenses into a fluidizing bed comprising WCl6 β-form crystals wherein the condenser vapor is maintained at one or more temperatures ranging from about 100 to about 180° C. and wherein an end product stream comprising the composition is withdrawn from the condenser via a dip tube and wherein the at least one impurity is removed from the condenser through an exhaust.

In another aspect, there is provided a vessel for the vaporization and/or sublimation of $WCl_6$ which is substantially free of at least one impurity and comprises at least 95% by weight or greater of β-form crystal as measured by XRD. The vessel is typically constructed of a vessel having a base, top (which may be a lid), and sidewall that define an interior volume to contain the precursor material. The use of the word vaporization (or vaporizing) herein includes vaporization and/or sublimation of the precursor wherever it is used. Upon application of heat and/or reduced pressure, the precursor material may transform from a solid and/or liquid phase to its gaseous phase.

In one embodiment, described herein is a composition for depositing a tungsten film or tungsten-containing film by a chemical vapor deposition or atomic layer deposition process, the composition comprising:
at least 90%, preferably 95%, more preferably 99% by weight or greater of β-$WCl_6$ and most preferably 99.9% by weight or greater.

In another embodiment, described herein is a delivery system for depositing a tungsten film or tungsten-containing film comprising:
a composition comprising at least 90%, preferably 95%, more preferably 99%, and most preferably 99.9% by weight or greater of β-$WCl_6$;
a vessel; and
wherein the composition is inside the vessel.

In another embodiment, described herein is a process of preparing a delivery system for depositing a tungsten film or tungsten-containing film comprising:
providing a vessel;
providing a composition comprising at least 90%, preferably 95%, and more preferably 99% by weight of $WCl_6$ wherein the composition is inside the vessel; and
heating the vessel until 90.0%, preferably 95%, more preferably 99%, and most preferably 99.9% by weight of $WCl_6$ is β-$WCl_6$.

In yet another embodiment, described herein is a system for purifying a crude material comprising $WCl_6$ and at least one impurity comprising:
(a) at least one boiler;
(b) a condenser;
(c) a connector in fluid communication with the boiler and the condenser;
(d) a carrier gas in fluid communication with the boiler; and
(e) a fluidizing gas in fluid communication with the connector and the condenser;
wherein
the at least one impurity comprising at least one of trace metals, tungsten oxytetrachloride ($WOCl_4$), and tungsten pentachloride ($WCl_5$);
the at least one boiler is maintained at a temperature above the boiling point of $WCl_6$ to convert filled crude material to gaseous phase mixing with the carrier gas to obtain boiler vapor stream;
the connector is filled with the boiler vapor stream;
the condenser containing the fluidizing gas mixing with the boiler vapor stream to obtain a condenser vapor containing purified material comprising $WCl_6$ at the bottom of the condenser while the fluidizing gas carrying the at least one impurity to the top of the condenser;

the carrier gas and the fluidizing gas are not react with $WCl_6$; and the fluidizing gas is cooler than the boiler vapor stream.

In the purification system, the at least one boiler can be maintained at >300° C.; and the condenser vapor is maintained at one or more temperatures ranging from about 100 to about 180° C. Furthermore, a molar ratio of the fluidizing gas and the boiler vapor stream is <200:1; and a molar ratio of the carrier gas to the crude material in the boiler vapor stream is <10:1. The condenser can further comprise a dip tube in fluid communication with a vacuum pump to withdraw the purified material comprising $WCl_6$ from the bottom of the condenser.

The purification system can further comprise a vessel in fluid communication with the dip tube for housing the purified material comprising $WCl_6$ wherein the purified material comprising $WCl_6$ comprises at least 90% or 99% by weight or greater of $\beta$-$WCl_6$.

DETAILED DESCRIPTION OF THE INVENTION

Figure 1:
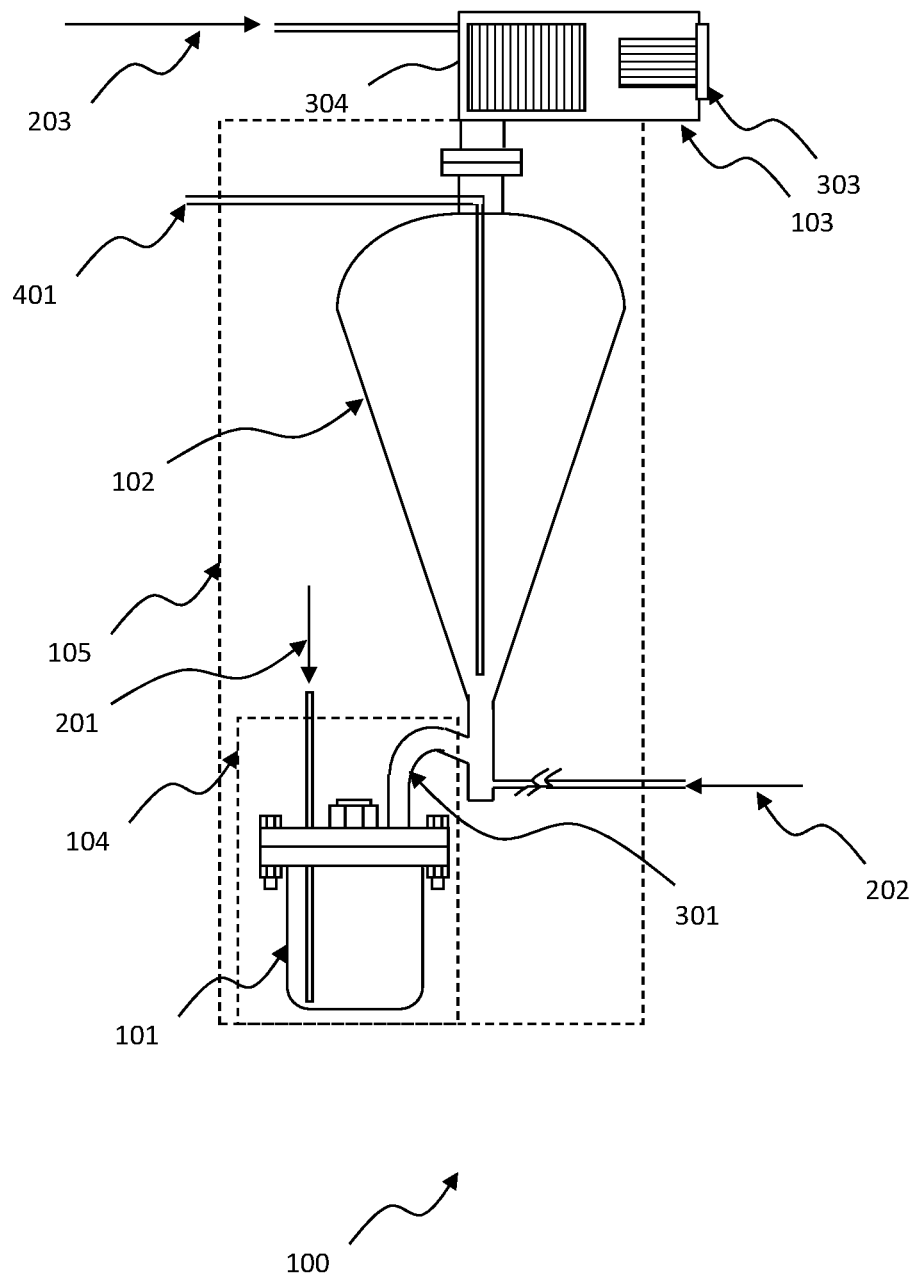
FIG. 1 provides is an embodiment of an exemplary purification system for a metal halide material such as $WCl_6$.

A method, system, and apparatus to produce a composition comprising a metal halide material, such as without limitation, $WCl_6$ that is substantially free of impurities and having at least 90%, preferably 95% and more preferably 99% by weight or greater of the $\beta$-$WCl_6$ as determined by XRD is described herein.

As used herein, the term "substantially free" as it relates to impurities such as, for example, chlorides and fluorides, bromides, and metals, means about 1 weight percent or less, 100 ppm (by weight) or less, 10 ppm or less, 5 ppm or less. 3 ppm or less, and 1 ppm or less, and most preferably 0 ppm of impurities. For example, in compositions comprising $WCl_6$, the composition comprising $WCl_6$ comprises 1 weight percent or less or 100 ppm or less of one or more of the following impurities: trace metals (e.g., iron, chromium, and sodium), tungsten oxytetrachloride ($WOCl_4$), tungsten pentachloride ($WCl_5$), or other impurities.

In one particular embodiment of the composition described herein, the composition comprises tungsten hexachloride which is substantially free of at least one impurity and wherein the tungsten hexachloride comprises at least 90% by weight or greater of a $\beta$-form crystal and 10% by weight or less of the $\alpha$-form as measured by X-ray diffraction. In certain embodiments, the $WCl_6$ comprises at least 90% by weight or greater, or at least 96% by weight or greater, or at least 97% by weight or greater, or at least 98% by weight or greater, or at least 99% by weight or greater of $\beta$-form crystals as measured by X-ray diffraction (XRD), and the balance of the composition is $\alpha$-form crystal no impurities.

The method, system and apparatus described herein may use one of several methods for capture of a condensable material. In one embodiment, the condensable material such as $WCl_6$ is captured via condensation.

Capture by condensation is achieved by operating the condenser under temperature, pressure or other conditions such that the condensable material is a solid as indicated by its phase-diagram.

In one aspect, the method described herein meets one or more of the needs of the art by using a process that comprises condensation and fluidization wherein at least a portion of the condensation and fluidization is conducted at the same time. In this embodiment, a crude material, which contains the desired end metal halide or condensable product such as $WCl_6$ and undesirable impurities such as without limitation, metals, tungsten oxytetrachloride, and tungsten pentachloride, is heated to the boiling point of $WCl_6$ or about 300° C., preferably 350° C., wherein the tungsten containing-compound or the desired compound $WCl_6$ and undesired tungsten compounds $WOCl_4$ and $WCl_6$ are sublimed into the vapor phase. A small amount of a carrier gas such as, without limitation, an inert gas (e.g., $N_2$), is used to carry the sublimed vapor into the fluidization zone, wherein the vapor is mixed directly with a fluidizing gas to provide a condensed solid. The condensed solid is fluidized in the zone and maintained at one or more temperatures which allow the condensed solid to act as a nucleation center for the selective crystallization of the product to the $\beta$-form. The remaining light impurities are carried by the fluidizing gas into a cooling zone, wherein a cooling gas stream is provided to form an effluent stream, and is condensed into solid. The effluent stream is passed through a filter and vented. The heavy impurities, such as metal, remain in the boiling zone and are removed as heel. While the method, system and/or apparatus described herein is used for capturing and reusing tungsten hexachloride ($WCl_6$), it is believed that these methods, systems, and/or apparatus, can be extended to other sublimable or metal halide materials.

Described herein is a method, system, and apparatus to provide desirable condensable materials, such as but not limited to metal halides such as $WCl_6$, in yields and purity levels that allow the condensable materials to be suitable for use as a precursor for the production of a semiconductor device. The metal halide precursors according to the present invention, and compositions comprising the metal halide precursors according to the present invention, are preferably substantially free of impurities and are 90%, preferably 95% and more preferably 99% by weight or greater $\beta$-$WCl_6$.

In one embodiment of the method described herein, the crude material comprising the desired metal halide is purified through sublimation at different boiling points of product and impurities by providing at least two or more temperature zones. In the same or an alternative embodiment, such separation can be achieved by using different vapor pressure at a fixed temperature, when a non-reactive gas such as an inert gas which is used as a fluidizing gas is present. For example, at 150° C., the vapor pressure for $WCl_6$ is 1.73 torr, whereas for $WOCl_4$ is 21.37 torr. By providing the suitable amount of fluidizing gas such as nitrogen, the $WOCl_4$ can be kept in gaseous phase whereas the majority of $WCl_6$ can be condensed.

The crude material may comprise 80% by weight or greater or 85% by weight or greater $WCl_6$ and the balance impurities such as $WOCl_4$, $WCl_5$, and other metals.

In an embodiment of the method described herein, a boiler is loaded with a crude material comprising $WCl_6$. A relatively higher amount of a carrier gas to boiler loading will lead to very dilute boiler vapor stream which, although it may increase the product purity, it will decrease product yield. A certain amount of carrier gas control the boil up rate of crude material and preventing clogging. Therefore, a suitable carrying gas flow rate is desirable. In certain embodiments, the carrier gas is an inert gas such as nitrogen. In this or other embodiments, the carrier gas may also comprise chlorine gas which prevents further formation of the impurity $WCl_5$.

In addition to purifying the crude material, the method and system described herein provides a $WCl_6$ which has a controlled particle size and crystal form or at a $WCl_6$ composition comprising at least 90 percent by weight (wt %) of β-$WCl_6$, or at least 95 wt % of β-$WCl_6$, or at least 99 wt % or greater β-$WCl_6$. These attributes are influenced during the fluidization step. After the crude material is processed in the boiler, the boiler vapor stream is then introduced into the condenser/fluidizer. Fluidization is a known process for crystallization with particle size control. For example, spray drying followed by fluidization will yield uniformed large crystal size. In general, the higher the fluidization gas flow rate, the larger the particle size. However, high fluidizing gas velocity will potentially create short passage and blowing off duct, which lowers yield. In one particular embodiment, the same gas is used as the carrier gas and fluidizing gas so the gas-material ratio is fixed by material and energy balance. For a simple and economic production process, crystallization temperature plays important role controlling the yielded crystal form. Product crystallized at relatively high temperature produces higher content of β-$WCl_6$.

In the embodiments described herein, the method, apparatus and system described herein comprises: a boiler for the vaporization of the crude material to provide a boiler vapor stream, a condenser for the product condensing step, and a cooler for condensing light (e.g., lower boiling point impurities). A crude material comprising the end product material such as WCl6 and one or more impurities is loaded in the boiler, and heated to around boiling point of the end product material. In one particular embodiment wherein the desired end product material is $WCl_6$, the boiler is heated to around boiling point of $WC_{l6}$ or ~350° C. A heated carrier gas, which is heated to one or more temperatures ranging from about ambient up to the boiling point of the desired end product, is introduced into the boiler, which helps to vaporize the material and carries the boiler vapor stream into the bottom of the condenser through the connector. At the bottom of the condenser or the connector, a cooler in temperature gas or fluidizing gas is mixed with the boiler vapor stream vigorously to provide a condenser stream, which condenses the material to form a crystal. The condensed material within the condenser stream collides with previously condensed solid, allowing the crystal to grow. Condensed crystals form a fluidization bed, under controlled temperature conditions, and continue to grow. The fluidizing gas, together with light impurities forms an effluent gas which is passed through the fluidization bed and enters into the cooler, wherein which the effluent gas is further cooled with suitable means, to condense the light impurities. The effluent gas is then passed through a filter and vented, thereby trapping the majority of the solid particles within the system.

In certain embodiments, heaters are used in the condenser. During normal operation, the heater keeps the wall of the condenser at certain temperature, slightly higher or about 0 to about 10° C. higher than the fluidizing zone in the connector. This causes any solid material to condense in the fluidized bed rather than on the walls of the condenser, which is potentially a clogging factor and could decrease yield and through put. In some embodiments, the condenser is kept at uniformed temperature throughout the purification process. In other embodiments, multiple temperature points are used. For example, during initial startup, the condenser is kept at a relatively higher temperature, thereby preventing light impurity formation in the condenser. After the system startup, the condenser can be maintained at lower temperature, preventing loss of end product and low yield. Upon finishing the process, the condenser can be kept at high temperature to evaporate all material on the condenser wall, keeps the condenser surface clean.

In certain embodiments, the condenser is made in conical shape. This gives increasing cross sectional area along the height of the fluidized bed. The superficial velocity of fluidizing gas reduces along the height, thereby preventing dust off and loss of product.

In certain embodiments, the fluidizing gas is guided into the condenser through a connector having multiple off center counter faced ports, to form a tangential or helical flow. The tangential or helical flow motion in the connector helps to eliminate dead zone in the fluidized bed, as well as preventing flow path shortcut.

Yet in other embodiments, a dip tube can be inserted into the condenser, with the end of the dip tube located at bottom of the fluidized bed. Periodically, a vacuum is applied to the dip tube to withdrawn the substantially pure $WCl_6$ β-form crystals, which are then transferred into a storage container, as a means for automatic harvesting.

FIG. 1 provides one embodiment of the system and apparatus described herein. Referring to FIG. 1, the purification comprises at least one boiler 101, in which crude material is filled. The boiler is heated to one or more temperatures at or above the boiling point of $WCl_6$ or about 350° C. by the heater 104 or other means, which causes the crude material to vaporize into gaseous phase. A heated carrier gas stream 201 enters the boiler 101, sweeps off the gaseous material and reduces the vapor pressure in the boiler to provide a boiler vapor stream, which allows for faster boil up rate of raw material, helping control the ratio of material vapor to fluidizing gas in the fluidizing zone. The boiler vapor stream generated in the boiler is then fed through a connection port 301 into the bottom of the condenser 102. The relatively cooler fluidizing gas 202 also enters the bottom of the condenser, at which mixed vigorously with the boiler vapor stream, at a predetermined ratio. The vapor is cooled to a preferred temperature range, at which the $WCl_6$ in the condenser stream will condense and form crystal, whereas the vapor pressure for light impurities is less than the saturation level, and hence will be carried out of the condenser into cooler 103, achieving separation and purification. Condenser 102 is heated by an environmental heat 105 such as a convection oven. The wall of condenser 102 is maintained at a temperature slightly higher than the fluidizing zone, to prevent the condensation of material on the wall. The impurities, carried by the fluidizing gas, form an effluent gas which enters the cooler 103, in which additional cooling is provided, to condense them into solid. The cooling can be another inert cool gas stream 203, or a heat exchanger 304, such as air cooled radiator. By condensing the vapor into solid, the cleaned effluent gas can then be vented by passing through a filter 303, as exhaust.

In the method, apparatus, and system described herein, one of the ways to provide one or more of the following properties of the desired end material, such as target crystal form, controlled particle size, high yield, and high purity, is to control the temperature in the fluidizing zone within the connector. Ideally, the product crystal of the desired end product should be formed under temperature at one or more temperatures ranging from about 100° C. to about 180° C., or from about 110° C. to about 160° C., or from about 120° C. to about 150° C., to form the β-form crystal. If the temperature range in the fluidizing zone is too high, excessive material will be carried over in the condenser vapor, leading to low yield.

Another key to achieve the above mentioned target is the ratio of inlet fluidizing gas to the inlet boiler vapor stream comprising $WCl_6$ at the bottom of the condenser. It is important to keep the ratio low, so that overall carryover material in the condenser is limited. Since the fluidizing gas cools the boiler vapor stream or output from the boiler, there is a lower limit for the ratio according to mass and heat balance. In general, the fluidizing gas will be heated majorly by the latent heat released from crystallization, plus the heat from the carrier gas, if the condenser wall temperature is maintained at target temperature. In one particular embodiment wherein the carrier gas and fluidizing gas are both $N_2$ and the target material is $WCl_6$, for a temperature ranging from 100 to 180° C., and ambient temperature $N_2$ gas is used, the molar ratio of gas to boiler vapor gas comprising $WCl_6$ vapor ratio should be <200:1, preferable <150:1, and more preferable <120:1. In certain embodiments, other carrier, fluidizing gases or both besides $N_2$ can be used as long as it will not react with $WCl_6$. Inert gas with high heating capacity is more preferable for keeping the ratio low. In an alternative embodiment, pre-cool the fluidizing gas will also add more cooling capacity, and hence reduce the ratio.

Yet another key to achieve good crystal growth and high yield is to feed the condenser with high concentration of vapor. This can be achieved by providing high temperature to the boiler, limiting the carrier gas supplied to the boiler, or a combination thereof. In certain embodiments, a molar ratio of the carrier gas to the crude material in the boiler vapor stream is <10:1, preferable <5:1, and more preferable <2:1, in molar unit. The boiler should be heated to >300° C., preferable >340° C., and more preferable >360° C. That way, with high vapor concentration in the boiler vapor stream, there is less process residence time is achieved for the same amount of raw material, leading to less carryover of material as the total amount of gas passed through is reduced. In certain embodiments, higher temperatures may be applied to the boiler. In this or other embodiments, an additional gas such as a preserving gas, $Cl_2$, may be introduced into the boiler to prevent decomposition of $WCl_6$. Typically trace amount of $Cl_2$ gas, e.g., 20 ppm is adequate for prevent $WCl_6$ decomposition, but higher concentration of $Cl_2$ can be used. High temperature requires higher level of preserving gas, which is less desirable as material corrosion becomes a concern. Preferably, the boiler temperature should be maintained at one or more temperatures below 400° C.

Figure 2:
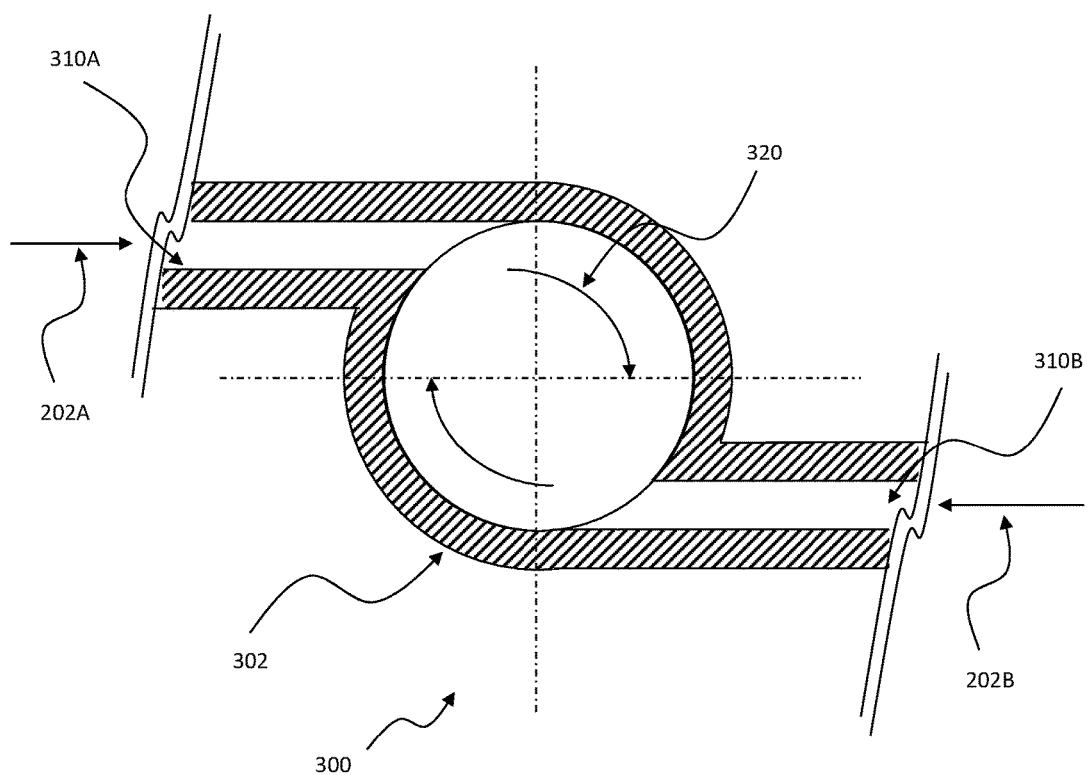
FIG. 2 is a diagram of an exemplary top view of the connector which connects the boiler and condenser in the purification system of FIG. 1 wherein the connector comprises a two-port fluidizing gas inlet apparatus for tangential/helical flow that is used in an embodiment of the method described herein.

In certain embodiments, the fluidized bed within the condenser may have short cut passes for gas. The shortcut leads to issues such as dead zone of the fluidization bed and direct carryover of vapor through the short cut. The dead zone will allow solid material to accumulate which cause partial or full clogging of the vapor can feed passage. The direct carryover through shortcut will lead to low yield. To prevent such shortcut condition, in certain embodiments, the fluidizing gas inlet can be arranged in a way to generate tangential or helical flow, as shown in FIG. 2. FIG. 2 is the top cut view of an example for fluidizing gas inlet. The gas inlet apparatus 300 has a body 302 that is mounted to the bottom of the condenser, with two off center faced gas inlet port 310A and 310B. The inlet gas 202A and 202B will generated vortex flow pattern, indicated by the arrow 320 sweeping all the cross sectional area. This way, the shortcut of the gas flow path is eliminated, and hence preventing both clogging and carryover in the connector.

It is important to let the vapor to condense and the crystal to grow, for particle size control purpose. Excessive material from the fluidized bed should be harvested periodically, so that the fluidized bed height is controlled within a range. Such harvesting is also allowing for continuous operation. In some embodiments, a dip tube 401 shown in FIG. 1 is placed in the condenser, with the open end placed close to the bottom of the condenser. During crystallization, tiny amount of inert gas is bled off from the dip tube, to prevent condensation inside the tube and clogs it. At predetermined interval, vacuum will be applied to the dip tube by a vacuum pump (not shown). Since the product is fluidized, the pressure difference generated by the vacuum can convey the crystal through the dip tube to a storage vessel (not shown). For crystal grow and β-from crystal production, the residence time of crystal in condenser (incubating at a desired temperature range) should be >10 minutes, preferable >20 minutes, more preferable >30 minutes. Therefore, the harvesting (e.g., removing of the $WCl_6$ through the dip tube) should be intermediate, at an interval of more than every 10 minutes, preferable more than every 20 minutes, and more preferable more than every 30 minutes.

A central processing unit or process controller is in electrical communication with any one or more of the elements provided in FIGS. 1-2. For example, in the embodiment shown in FIG. 1, process controller can be in electrical communication with one or more sensors associated with boiler 101, condenser 102, or cooler 103 to monitor its temperature, pressure, capacity or other relevant parameters. However, a process controller can be in electrical communication with additional elements of system or apparatus which are not shown in the Figures.

While the embodiments shown herein are described using $WCl_6$, it is anticipated that other condensable, metal halide materials that can be also provided.

In one embodiment of the invention there is provided a delivery system for the vaporization and/or sublimation which comprises $WCl_6$ containing at least 95% by weight or greater of β-form as measured by XRD inside of a vessel having a base, top (which may be a lid), and sidewall that define an interior volume to contain the precursor material. The use of the word vaporization (or vaporizing) herein includes vaporization and/or sublimation of the precursor wherever it is used. Upon application of heat and/or reduced pressure, the precursor material may transform from a solid and/or liquid phase to its gaseous phase.

In one embodiment, the base, the sidewall, and/or the interior surface of the lid of the vessel may have at least one protrusion, which extends into the interior volume and contacts the precursor material. The at least one protrusion may aid in transferring the heat directly into the precursor material. In another embodiment, with or without the addition of heat, an inert carrier gas, such as, for example, nitrogen, hydrogen, helium, argon, or other gas, is flowed through the interior volume and combines with the gaseous phase of the precursor material to provide a precursor-containing gaseous stream. In another embodiment, a vacuum may be used, alone or in conjunction with the inert gas and/or heating, to withdraw the precursor-containing gaseous stream from the vessel. The precursor-containing gaseous stream may be then delivered to downstream production equipment, such as, for example, a reaction chamber for deposition. The vessel may provide for a continuous flow of precursor-containing gaseous stream while avoiding "cold spots" or other problems attributable to the condensation of vapors contained therein. The vessel may also provide a consistent and reproducible flow rate, which may be advantageous for a variety of manufacturing processes.

EXAMPLES

Example 1: Preparation of $WCl_6$ Composition in $\beta$-$WCl_6$

The samples of $WCl_6$, supplied by H.C.Starck and composed of a mixture of alpha- and beta-phases were loaded into SS316 containers, backfilled with high purity nitrogen gas, sealed and heated inside the oven at 100° C., 140° C., 175° C. or 200° C. for 24 hours.

The samples before and after heating were analyzed by X-ray diffraction (XRD) method to determine relative amounts of alpha- and beta-phases in the samples. The samples for XRD were prepared inside argon purged glovebox. A portion of each sample was ground using the dried, cooled agate mortar and pestle. Each ground portion was pressed flat onto separate low-background mounts and sealed inside XRD cell designed for analysis of air-sensitive samples. The sealed samples were removed from the glove box just prior to each XRD analysis and scanned on the Panalytical X'Pert Pro MRD over the range 10≤2≤80o using Co-Kα radiation. Crystalline phases in the XRD pattern were identified by comparing Bragg peak positions and relative intensities to those from reference patterns found in the ICDD PDF-4+2012 database. The relative amounts of each phase in the crystalline portion of the sample were refined using the Rietveld method with the initial model including reference structures from the ICDD database. The samples contained trace amounts of tungsten oxychloride due to slow air diffusion into XRD sampling cell. Relative amounts of alpha-$WCl_6$ and beta-$WCl_6$ in the samples are summarized in Table 1.

Unexpectedly, the samples heated at 140° C., 175° C. and 200° C. transitioned to greater than 99 weight % $\beta$-$WCl_6$ after this thermal treatment, as shown in Table 1.

The example suggests that a delivery system comprising a mixture of two phases of $WCl_6$ can be pre-heated at 140° C. and above to transform the mixture of two different phases into the beta-phase of $WCl_6$. It is expected that beta-phase of $WCl_6$ will provide more consistent chemical delivery to semiconductor device manufacturing process since no further change in phase composition after thermal pre-treatment.

TABLE 1

Relative composition of $WCl_6$ phase in samples heated inside of SS316 vessel.

| | Starting Material | Heated to 100° C. for 24 hours | Heated to 140° C. for 24 hours | Heated to 175° C. for 24 hours | Heated to 200° C. for 24 hours |
|---|---|---|---|---|---|
| α-$WCl_6$ | 78 | 77 | <1 | <1 | <1 |
| β-$WCl_6$ | 22 | 23 | >99 | >99 | >99 |

Example 2 Purification of $WCl_6$-No α-$WCl_6$

A batch purification test was carried out. The process started with 100 gram of $WCl_6$ (supplied by H.C. Starck), comprising ~78 relative wt % of alpha-$WCl_6$ and 22 relative wt % of beta-$WCl_6$ (assuming the total wt % of alpha-$WCl_6$ and beta-$WCl_6$ is 100%) was heated to 360° C. in a boiler.

A stream of 0.2 liters per minute (LPM) of nitrogen ($N_2$) gas was preheated to a temperature of 350° C. and introduced into the boiler as a carrier gas. This provided a boiler vapor stream comprising $WCl_6$ which has a boil up rate of about 116 g/hour, and the molar ratio of carrier gas to material in the boiler vapor stream was 2:1. The boiler vapor stream was supplied to the bottom of the condenser and a flow of 12 LPM of ambient temperature fluidizing gas comprising $N_2$ gas was also supplied to the bottom of the condenser at the same time.

The molar ratio of fluidizing gas to boiler vapor stream was around 110:1. In order to prevent the condensation of the boiler vapor stream at the connector between boiler and the bottom of condenser, the connector was heat to a temperature of 360° C. Since the test setup was essentially small, with the diameter for the bottom of the condenser to be 2 cm, a certain amount of heat was conducted from the connector to this zone, and picked up by the fluidizing gas. The measured temperature for the fluidizing gas at this inlet was 65° C. The fluidized bed temperature was maintained at a temperature ranging from about 110 to about β0° C. The condenser wall temperature was maintained at a temperature ranging from about 110 to about 120° C. Once the boiler temperature reached its set point, the purification process started, and was kept running for 1 hour. The heaters were then shut down while the gas streams were continuously supplied, to keep the moisture away. Once the system was cooled down, the material in the condenser was collected for analysis. The apparent yield (product/raw) was 68.4% wt/wt.

The sample was analyzed by X-Ray diffraction, as described in Example 1. X-ray diffraction indicated that the product has 97.1 wt % of $\beta$-$WCl_6$, balanced with trace amount of $WOCl_4$ and $WCl_5$. No α-$WCl_6$ was detected in the mixture, suggesting that relative wt % of $\beta$-$WCl_6$ was >99 wt %.

Example 3: Purification of $WCl_6$-No $WCl_5$ 180 gram of crude $WCl_6$, containing 43 wt % of alpha $WCl_6$, 48 wt % of beta-$WCl_6$ and 9 wt % of $WOCl_4$ was loaded to the boiler and was vaporized at 320° C., as described in Example 2.

The carrier gas flow rate was 0.2 LPM, and the fluidizing gas flow rate was 15 LPM. The carrier gas contained 20 ppm of chlorine. The condenser temperature was controlled in the range of 120-β0° C.

114 gram of product was collected from the condenser. Purified sample was analyzed by XRD, as described in the Example 1. XRD result showed composition containing 97 wt % of beta-$WCl_6$, <1 wt % of alpha-$WCl_6$ and no detectable peaks of $WCl_5$. 2 wt % of $WOCl_4$ was detected in the sample likely due to slow air diffusion into XRD sampling cell. Thus, this process can produce tungsten hexachloride with no detectable amount of $WCl_5$ and >99% rel. wt % of beta-$WCl_6$.

While the principles of the claimed invention have been described above in connection with preferred embodiments, it is to be clearly understood that this description is made only by way of example and not as a limitation of the scope of the claimed invention.

The invention claimed is:

1. A composition for depositing a tungsten film or tungsten-containing film by a chemical vapor deposition or atomic layer deposition process, the composition comprising:
at least 99% by weight or greater of β-$WCl_6$.

2. The composition of claim 1, wherein the composition further comprises 1% by weight or less of $WOCl_4$.

3. The composition of claim 1, wherein the composition comprises 1% by weight or less of α-$WCl_6$.

4. The composition of claim 3, wherein the composition comprises at least 99.9% by weight or greater of β-$WCl_6$.

5. A delivery system for depositing a tungsten film or tungsten-containing film comprising:
a composition comprising at least 90% by weight or greater of β-$WCl_6$;
a vessel; and
wherein the composition is inside the vessel and the vessel is maintained at a temperature ranging from 140° C. to 200° C.

6. The delivery system of claim 5, wherein the composition comprises at least 95% by weight or greater of β-$WCl_6$ and 5% by weight or less of α-$WCl_6$.

7. The delivery system of claim 5, wherein the composition comprises at least 99.9% by weight or greater of β-$WCl_6$ and 1% by weight or less of α-$WCl_6$.

8. The delivery system of claim 5, wherein the composition comprises at least 99.9% by weight or greater of β-$WCl_6$.

9. A process of preparing a delivery system for depositing a tungsten film or tungsten-containing film comprising:
providing a vessel;
providing a composition comprising at least 90% by weight of $WCl_6$ wherein the composition is inside the vessel; and
heating and maintaining the vessel to have at least 90.0% by weight of $WCl_6$ is β-$WCl_6$.

10. The process of claim 9, wherein the heating is performed until 95.0% by weight of $WCl_6$ is β-$WCl_6$.

11. The process of claim 9, wherein the heating is performed until 99.0% by weight of $WCl_6$ is β-$WCl_6$.

12. The process of claim 9, wherein the heating is performed until 99.9% by weight of $WCl_6$ is β-$WCl_6$.

13. The process of claim 9, wherein the vessel is heated and maintained at a temperature of 140° C. to 200° C.

14. A system for purifying a crude material comprising $WCl_6$ and at least one impurity comprising:
(a) at least one boiler;
(b) a condenser;
(c) a connector in fluid communication with the boiler and the condenser;
(d) a carrier gas in fluid communication with the boiler; and
(e) a fluidizing gas in fluid communication with the connector and the condenser;
wherein
the at least one impurity comprising at least one of trace metals, tungsten oxytetrachloride ($WOCl_4$), and tungsten pentachloride ($WCl_5$);
the at least one boiler is maintained at a temperature above the boiling point of $WCl_6$ to convert filled crude material to gaseous phase mixing with the carrier gas to obtain boiler vapor stream;
the connector is filled with the boiler vapor stream;
the condenser containing the fluidizing gas mixing with the boiler vapor stream to obtain a condenser vapor containing purified material comprising $WCl_6$ at the bottom of the condenser while the fluidizing gas carrying the at least one impurity to the top of the condenser;
the carrier gas and the fluidizing gas are not react with $WCl_6$; and
the fluidizing gas is cooler than the boiler vapor stream.

15. The system of claim 14, wherein the at least one boiler is maintained at >300° C.; and the condenser vapor is maintained at one or more temperatures ranging from about 100 to about 180° C.

16. The system of claim 14; wherein a molar ratio of the fluidizing gas and the boiler vapor stream is <200:1; and a molar ratio of the carrier gas to the crude material in the boiler vapor stream is <10:1.

17. The system of claim 14; wherein the condenser further comprises a dip tube in fluid communication with a vacuum pump to withdraw the purified material comprising $WCl_6$ from the bottom of the condenser.

18. The system of claim 14; wherein the purified material comprising $WCl_6$ comprises at least 90% by weight or greater of β-$WCl_6$.

19. The system of claim 14; wherein the purified material comprising $WCl_6$ comprises at least 99% by weight or greater of β-$WCl_6$.

20. The system of claim 14; wherein the system further comprises a vessel in fluid communication with the dip tube for housing the purified material comprising $WCl_6$ wherein the purified material comprising $WCl_6$ comprises at least 90% or 99% by weight or greater of β-$WCl_6$.

* * * * *